US009606195B2

(12) United States Patent
Klein et al.

(10) Patent No.: US 9,606,195 B2
(45) Date of Patent: Mar. 28, 2017

(54) HIGH RESOLUTION PLANAR HALL EFFECT SENSORS HAVING PLURAL ORIENTATIONS AND METHOD OF OPERATING THE SAME TO MEASURE PLURAL MAGNETIC FIELD COMPONENTS

(71) Applicants: BAR ILAN UNIVERSITY, Ramat Gan (IL); Anna Paperno, Beer Sheva (IL)

(72) Inventors: Lior Klein, Ramat Gan (IL); Asaf Grosz, Rishon Lezion (IL); Vladislav Mor, Holon (IL); Eugene Paperno, Beer-Sheva (IL); Shai Amrusi, Netivot (IL); Igor Faivinov, Ashkelon (IL); Mordechai Schultz, Holon (IL); Omer Sinwani, Rishon Lezion (IL)

(73) Assignees: BAR ILAN UNIVERSITY, Ramat Gan (IL); B. G. NEVEG TECHNOLOGIES AND APPLICATIONS LTD., Beer Sheva (IL)

( * ) Notice: Subject to any disclaimer, the term of this patent is extended or adjusted under 35 U.S.C. 154(b) by 0 days.

(21) Appl. No.: 14/195,228

(22) Filed: Mar. 3, 2014

(65) Prior Publication Data

US 2014/0247043 A1 Sep. 4, 2014

Related U.S. Application Data

(60) Provisional application No. 61/771,861, filed on Mar. 3, 2013.

(51) Int. Cl.
G01R 33/07 (2006.01)
(52) U.S. Cl.
CPC .................... *G01R 33/07* (2013.01)

(58) Field of Classification Search
CPC ..................................................... G01R 33/07
(Continued)

(56) References Cited

U.S. PATENT DOCUMENTS 4,053,829 A * 10/1977 Maruo ................... G01R 33/09
324/247
4,683,535 A * 7/1987 de Ridder .............. G01R 33/06
324/249

(Continued)

FOREIGN PATENT DOCUMENTS

JP 58-84477 * 5/1983 ............. H01L 43/06

OTHER PUBLICATIONS

Schuhl, A. et al., Lowfield magnetic sensors based on the planar Hall effect, Applied Physics Letters, May 15, 1995, p. 2751-2753, vol. 65, No. 20.

(Continued)

*Primary Examiner* — Jay Patidar
(74) *Attorney, Agent, or Firm* — Symbus Law Group LLC; Clifford D. Hyra

(57) ABSTRACT

The present invention discloses plural planar Hall-effect sensors each having a magnetic sensing region of an elongated shape, the magnetic sensing regions having plural orientations, wherein, for a ratio of long axis length to short axis length greater than a predetermined number, effective single magnetic domain behavior is exhibited in the sensing region, the sensing having shape-induced uniaxial magnetic anisotropy with the easy axis parallel to the long axis of the magnetic sensing region; further wherein the magnitude of the uniaxial magnetic anisotropy depends on the ratio of the thickness of the sensing region to the length of the short axis, and method of operating the same to measure plural magnetic field components.

18 Claims, 9 Drawing Sheets

(58) Field of Classification Search
USPC .......................................................... 324/251
See application file for complete search history.

(56) References Cited

U.S. PATENT DOCUMENTS

| | | | |
|---|---|---|---|
| 6,191,581 B1* | 2/2001 | Van Dau | G01R 33/09 |
| | | | 324/249 |
| 2011/0175605 A1* | 7/2011 | Kim et al. | 324/251 |
| 2011/0256640 A1* | 10/2011 | Dittmer | G01N 33/54373 |
| | | | 436/501 |
| 2014/0049253 A1* | 2/2014 | Tsujimoto | 324/228 |

OTHER PUBLICATIONS

Mor, V. et al., Planar Hall effect sensors with shape-induced effective single domain behavior, Journal of Applied Physics, 2012, p. 07E519-1-07E519-3, vol. 111.

Persson, A. et al., Modelling and design of planar Hall effect bridge sensors for low-frequency applications, Sensors and Actuators A: Physical, 2012, p. 459-465, vol. 189.

Lei, Z. Q., et al., Review of Noise Sources in Magnetic Tunnel Junction Sensors, Transactions on Magnetics, Mar. 3, 2011, vol. 47, No. 3.

* cited by examiner

HIGH RESOLUTION PLANAR HALL EFFECT SENSORS HAVING PLURAL ORIENTATIONS AND METHOD OF OPERATING THE SAME TO MEASURE PLURAL MAGNETIC FIELD COMPONENTS

FIELD OF THE INVENTION

The present invention generally pertains to a system and method for providing planar Hall effect sensors whose properties are determined by the shape and size of the sensing region in the sensor, made of magnetic thin film with an elongated shape, particularly an ellipse. Such sensors can have magnetic field resolution better than 1 nT/$\sqrt{Hz}$ at 0.1 Hz and better than 0.3 nT/$\sqrt{Hz}$ at 1 Hz while their cost is expected to be lower than that of commercially available magnetoresistance sensors or any other high resolution sensor. In addition, the fact that their properties are tailor-made by the shape and size, gives them important design advantages.

BACKGROUND OF THE INVENTION

Among the wide range of magnetic sensors, those based on magnetoresistance (MR) effects are particularly attractive as they combine low cost, small size, and relatively high resolution at room temperature. To date, within the group of MR sensors, anisotropic magnetoresistance (AMR) sensors have the best resolution. Other promising results were obtained for example by using an ensemble of tunneling magnetoresistance (TMR) sensors or by the integration of Micro Electro Mechanical System (MEMS) flux concentrators.

Planar Hall effect (PHE) sensors [(1) Mor V, Schultz M, Sinwani O, Grosz A, Paperno E, and Klein L (2012), "Planar Hall effect sensors with shape-induced effective single domain behavior," J. Appl. Phys., vol. 111, 07E519, doi: 10.1063/1.3680084; (2) Persson A, Bejhed R S, Østerberg F W, Gunnarsson K, Nguyen H, Rizzi G, Hansen M F, Svedlindh P (2013), "Modelling and design of planar Hall effect bridge sensors for low-frequency applications," Sensors and Actuators A, vol. 189, pp. 459-465, doi: 10.1016/j.sna.2012.10.037; and (3) Schuhl A, Nguyen Van Dau F, Childress J R (1995), "Low-field magnetic sensors based on the planar Hall effect," Appl. Phys. Lett., vol. 66, pp. 2751-2753, doi: 10.1063/1.113697] have important intrinsic advantages compared to AMR sensors. PHE sensors are less sensitive to temperature drift [(3) above], which limits the resolution at low frequencies. They are also much simpler compared to TMR or giant magnetoresistance sensors, which comprise a stack of layers fabricated in complex processes. Such a layer stack also results in additional sources of noise, which is difficult to control and suppress [Lei Z Q, Li G J, Egelhoff W F, Lai P T, Pong P W T (2011), "Review of noise sources in magnetic tunnel junction sensors," IEEE Trans. Magn., vol. 47, pp. 602-612, doi: 10.1109/TMAG.2010.2100814].

Despite the advantages, so far the reported resolution of PHE sensors is lower than that of AMR sensors.

Therefore, there is a long-felt need to provide planar Hall effect sensors that will manifest their intrinsic advantages. A very important factor that determines the sensitivity of the sensor is the direction of the easy magnetic axis and the magnitude of the magnetic anisotropy field. In addition, it is important to minimize the noise. This invention describes a method of fabricating PHE sensors where these properties are determined by the shape and size of the sensing area; therefore, they are easily tailor-made with predetermined properties. Furthermore, multiple sensors with different properties can be easily fabricated on a single chip thus opening the way for more complicated devices that will achieve extended operational range and simultaneous measurement of the two components of the magnetic field in the chip plane. The invention also describes methods for decreasing the noise which comprise of choosing an excitation current with appropriate amplitude and frequency.

SUMMARY OF THE INVENTION

It is an object of the present invention to disclose a system for providing planar Hall effect sensors that can be tailor-made for various applications by altering the shape and size of the sensing region in the sensor, thereby altering the direction and magnitude of the magnetic anisotropy of the sensor.

It is another object of the present invention to disclose a planar Hall-effect sensor, comprising:
a. two current-injecting terminals;
b. two voltage measuring terminals; and
c. a magentic sensing region of an elongated shape, said shape characterized by:
  (a) an easy axis;
  (b) a long axis;
  (c) a short axis perpendicular to said long axis;
  (d) a thickness t;
  (e) two ends, each of which is electrically connected to one said current-injecting terminal; and,
  (f) two sides, each of which is electrically connected to one said voltage measuring terminal;
  wherein, for a ratio of length of said long axis to length of said short axis greater than a predetermined number, effective single magnetic domain behavior is exhibited in said sensing region, with shape-induced uniaxial magnetic anisotropy with said easy axis parallel to said long axis of said magnetic sensing region; further wherein the magnitude of said uniaxial magnetic anisotropy depends on a ratio of said thickness t to said length of said short axis.

It is another object of the present invention to disclose the planar Hall-effect sensor, wherein said elongated shape is substantially a shape selected from a group consisting of: an ellipse, an oval, a rectangle, a fillet rectangle, an elongated hexagon, an elongated octagon, an elongated decagon, and any combination thereof.

It is another object of the present invention to disclose the planar Hall-effect sensor, wherein said predetermined number is greater than about 6.

It is another object of the present invention to disclose the planar Hall-effect sensor, wherein said long axis is less than about 30 mm long.

It is another object of the present invention to disclose the planar Hall-effect sensor, wherein said short axis is less than about 5 mm long.

It is another object of the present invention to disclose the planar Hall-effect sensor, wherein the thickness t of said sensing region is in the range of about 10 nm to about 1 μm, It is another object of the present invention to disclose the planar Hall-effect sensor, wherein said sensing region comprises a soft magnetic material, said soft magnetic material selected from a group consisting of: permalloy, and alloys consisting of elements selected from a group comprising, but not limited to: Ni, Co, Fe, Cr, N and any combination thereof.

It is another object of the present invention to disclose the planar Hall-effect sensor, wherein said sensing region comprises a non-magnetic material, said non-magnetic material capping said magnetic material, said non-magnetic material selected from a group comprising, but not limited to: tantalum, Ti, Cr, SiO, $Al_2O_3$ and any combination thereof.

It is another object of the present invention to disclose the planar Hall-effect sensor, wherein the effective value of said uniaxial magnetic anisotropy $H_k$ is calculated according to the following equation $$H_k \approx 4\pi M_s \frac{t}{b}$$

where t is said thickness of said sensing region, b is said length of said short axis and $M_s$ is the saturation magnetization of the material of the sensing region.

It is another object of the present invention to disclose the planar Hall-effect sensor, wherein, for said elliptical elongated shape; an optimal sensing region thickness $t_{opt}$ that minimizes equivalent magnetic noise is calculated from $$t_{opt} = \frac{H_a \cdot b}{4\pi M_s}$$

where $H_a$ is the intrinsic anisotropy field, b is the length of said short axis and $M_s$ is the saturation magnetization of the material of the sensing region.

It is another object of the present invention to disclose the planar Hall-effect sensor, wherein n sensors are fabricated on a single substrate, n is an integer greater than or equal to one.

It is another object of the present invention to disclose the planar Hall-effect sensor, wherein at least one of the following is true: (a) at least two of said n sensors have different effective anisotropies so as to measure different ranges of magnetic fields; (b) at least two of said n sensors have differently oriented long axes so as to measure the two components of the magnetic field in the plane of the chip, and any combination thereof.

It is another object of the present invention to disclose the planar Hall-effect sensor, wherein said at least two sensors of different anisotropies are characterized by a difference in parameter selected from a group consisting of: said ratio of said thickness t to said length of said short axis, said length of said long axis, said length of said short axis and any combination thereof.

It is another object of the present invention to disclose a method of using a planar Hall-effect sensor comprising steps of:
a. providing a planar Hall-effect sensor comprising:
  i. two current-injecting terminals;
  ii. two voltage measuring terminals; and
  iii. a magnetic sensing region of an elongated shape, said shape characterized by:
    (a) an easy axis;
    (b) a long axis,
    (c) a short axis perpendicular to said long axis,
    (d) a thickness t;
    (e) two ends, each of which is electrically connected to one said current-injecting terminal, and
    (f) two sides, each of which is electrically connected to one said voltage measuring terminal;
b. connecting said current-injecting terminals to a source of current;
c. connecting said voltage measuring terminals to a means of measuring voltage;
d. injecting an excitation current generated by said current source into said current-injecting terminals, said excitation current having a predetermined frequency; and
e. measuring voltage induced between said voltage measuring terminals by said excitation current;
wherein, for a ratio of length of said long axis to length of said short axis greater than a predetermined number, effective single domain magnetic behavior is exhibited in said sensing region, with shape-induced uniaxial magnetic anisotropy with said easy axis parallel to said long axis of said magnetic sensing region; further wherein the magnitude of said uniaxial magnetic anisotropy depends on said ratio of said thickness t to said length of said short axis.

It is another object of the present invention to disclose the method, additionally comprising step of selecting said elongated shape to be substantially a shape selected from a group consisting of: an ellipse, an oval, a rectangle, a fillet rectangle, an elongated hexagon, an elongated octagon, an elongated decagon, and any combination thereof.

It is another object of the present invention to disclose the method, additionally comprising step of selecting said predetermined number to be greater than about 6.

It is another object of the present invention to disclose the method, additionally comprising step of selecting the length of said long axis to be less than about 30 mm.

It is another object of the present invention to disclose the method, additionally comprising step of selecting the length of said short axis to be less than about 5.

It is another object of the present invention to disclose the method, additionally comprising step of selecting the thickness t of said elliptical sensing region to be in a range of about 10 nm to about 1 μm.

It is another object of the present invention to disclose the method, additionally comprising step of comprising said sensing region of a soft magnetic material, said soft magnetic material selected from a group consisting of: permalloy, and alloys consisting of elements selected from a group comprising, but not limited to: Ni, Co, Fe, Cr, N and any combination thereof.

It is another object of the present invention to disclose the method, additionally comprising steps of comprising said sensing region of a non-magnetic material, said non-magnetic material capping said magnetic material, said non-magnetic material selected from a group comprising, but not limited to: tantalum, Ti, Cr, SiO, $Al_2O_3$ and any combination thereof.

It is another object of the present invention to disclose the method, additionally comprising step of calculating the effective value of said uniaxial magnetic anisotropy $H_k$ from $$H_k \approx 4\pi M_s \frac{t}{b}$$

where t is the thickness of said sensing region, b is the length of said short axis and $M_s$ is the saturation magnetization of the material of the sensing region.

It is another object of the present invention to disclose the method, additionally comprising step of, for said elliptical elongated shape, calculating an optimal sensing region thickness $t_{opt}$ that minimizes equivalent magnetic noise from $$t_{opt} = \frac{H_a \cdot b}{4\pi M_s}$$

where $H_a$ is the intrinsic anisotropy field, b is the length of said short axis and $M_s$ is the saturation magnetization of the material of the sensing region.

It is another object of the present invention to disclose the method, additionally comprising steps of exciting the sensor by an AC excitation current, and selecting the frequency of said current to be in a range of about 500 Hz to about 1 MHz, such that the frequency of said output voltage is in a range where 1/f noise of an electronic preamplifier is negligible.

It is another object of the present invention to disclose the method, additionally comprising steps of selecting the amplitude of said excitation current to be sufficiently large such that 1/f noise of the sensor is dominant in the frequency range of interest for the measured field.

It is another object of the present invention to disclose the method, additionally comprising step of fabricating n sensors on a single substrate, n is an integer greater than or equal to one.

It is another object of the present invention to disclose the method, additionally comprising at least one step selected from a group consisting of: (a) providing at least two of said n sensors having different effective anisotropies so as to measure different ranges of magnetic fields; (b) providing at least two of said n sensors having differently oriented long axes so as to measure the two components of the magnetic field in the plane of the chip, and any combination thereof.

It is another object of the present invention to disclose the method, additionally comprising step of characterizing said at least two sensors of different anisotropies by a difference in parameter selected from a group consisting of: said ratio of said thickness t to said length of said short axis said length of said long axis, said length of said short axis, and any combination thereof It is another object of the present invention to disclose a chip comprising n planar Hall-effect sensors, n is an integer greater than or equal to one, each said planar Hall-effect sensor comprising:
a. an easy axis;
b. two current-injecting terminals;
c. two voltage measuring terminals; and
d. a magnetic sensing region, of an elongated shape, said shape characterized by:
  (i) a long axis,
  (ii) a short axis perpendicular to said long axis,
  (iii) a thickness t;
  (iv) two ends, each of which is electrically connected to one said current-injecting terminal, and
  (v) two sides, each of which is electrically connected to one said voltage measuring terminal;
wherein, for a ratio of length of said long axis to length of said short axis greater than a predetermined number, effective single domain magnetic behavior is exhibited in said sensing region, with shape-induced uniaxial magnetic anisotropy with said easy axis parallel to said long axis of said magnetic sensing region; further wherein at least one of the following is true: (a) at least two of said n sensors have different effective anisotropies so as to measure different ranges of magnetic fields; (b) at least two of said n sensors have differently oriented long axes so as to measure the two components of the magnetic field in the plane of the chip, and any combination thereof.

It is another object of the present invention to disclose the chip, wherein at least one of the following is held true:
(a) said elongated shape is substantially a shape selected from a group consisting of: an ellipse, an oval, a rectangle, a fillet rectangle, an elongated hexagon, an elongated octagon, an elongated decagon, and any combination thereof.
(b) said long axis is less than about 30 mm long;
(c) said short axis is less than about 5 mm long;
(d) said thickness of said sensing region is in a range from about 10 nm to about 1 μm; and any combination thereof.

It is another object of the present invention to disclose the chip, wherein at least one of the following is held true:
(a) the effective value of said uniaxial magnetic anisotropy $H_k$ is calculated according to the following equation $$H_k \approx 4\pi M_s \frac{t}{b}$$

where t is the thickness of said sensing region, b is the length of said short axis and $M_s$ is the saturation magnetization of the material of the sensing region;
(b) for said elliptical elongated shape, an optimal sensing region thickness $t_{opt}$ that minimizes equivalent magnetic noise is calculated from $$t_{opt} = \frac{H_a \cdot b}{4\pi M_s}$$

where $H_a$ is the intrinsic anisotropy field, b is said length of said short axis and $M_s$ is the saturation magnetization of the material of the sensing region.

BRIEF DESCRIPTION OF THE FIGURES

In order to better understand the invention and its implementation in practice, a plurality of embodiments will now be described, by way of non-limiting example only, with reference to the accompanying drawings, wherein.

DETAILED DESCRIPTION OF THE PREFERRED EMBODIMENTS

The following description is provided, alongside all chapters of the present invention, so as to enable any person skilled in the art to make use of said invention and sets forth the best modes contemplated by the inventor of carrying out this invention. Various modifications, however, will remain apparent to those skilled in the art, since the generic principles of the present invention have been defined specifically to provide a means and method for providing planar Hall effect sensors that can be tailor-made with predetermined properties for various applications by altering the shape and size of the sensing region in the sensor, thereby altering the direction and magnitude of magnetic anisotropy of the sensor.

The term 'easy axis' hereinafter refers to an energetically favorable direction of spontaneous magnetization.

The term 'about' hereinafter refers to a value within 10% of the nominal value.

The term 'single domain' hereinafter refers to a region in which the magnetization does not vary across the region.

The term 'Hooge constant' hereinafter refers to a dimensionless empirical constant related to 1/f noise.

The terms 'magnetic field resolution' and 'equivalent magnetic noise' hereinafter refer to the magnetic field at a specific frequency that generates an output voltage which is equal to the amplitude spectral density of the total noise of the PHE sensor including its electronics at the same frequency.

The terms 'field sensitivity' or 'gain' hereinafter refers to the ratio between the output voltage and the magnetic field amplitude applied perpendicular to the easy axis.

The term 'fillet rectangle' hereinafter refers to a rectangle with rounded corners.

The terms 'substrate' and 'chip' hereinafter refers to the slice of semiconductor material with specified electronic characteristics on which the sensors disclosed herein are created. As used herein, 'substrate' and 'chip' are synonymous.

Reference labels in the figures herein refer only to the figure in which they appear. The same reference label may refer to different items in different figures.

Figure 1:
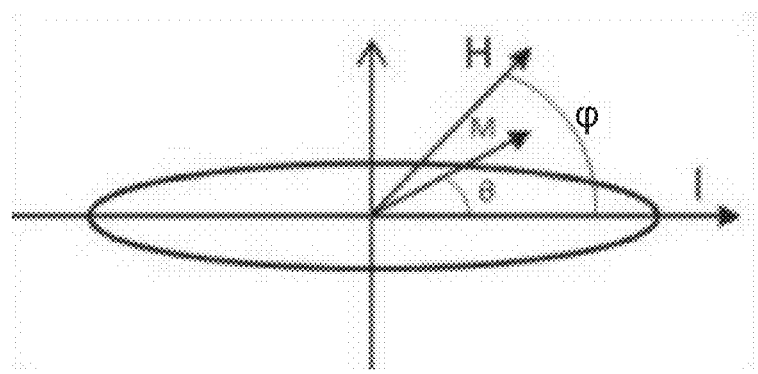
FIG. 1 depicts the angular relations in the sensor, showing the direction of the excitation current, I, the direction of the magnetization M, the angle θ between them, the direction of the applied magnetic field H and the angle ϕ between H and I.

In reference to FIG. 1, the directions of the magnetic field (H) and the magnetization M are shown, relative to the current (I). The angles θ and φ are also shown, where θ is the angle between the current I and the magnetization M and φ is the angle between the magnetic field H and the current I.

In polycrystalline ferromagnetic films, where crystal symmetry effects are averaged out, the longitudinal and transverse resistivities depend on the angle θ (FIG. 1) between the excitation current and the sensor magnetization as follows:

$$\rho_{xx} = \rho\perp + \Delta\rho \cos 2\theta \quad (1)$$

$$\rho_{xy} = \tfrac{1}{2}\Delta\rho \sin 2\theta \quad (2)$$

where $\Delta\rho = \rho\| - \rho\perp$, $\rho\|$ and $\rho\perp$ are the resistivities parallel and perpendicular to the magnetization, respectively.

Eq. (1) describes the anisotropic magnetoresistance (AMR) effect, whereas eq. (2) describes the planar Hall effect (PHE). The PHE resistivity is sensitive only to $\Delta\rho$, whereas the AMR resistivity is sensitive also to the resistivity and its temperature dependence.

Magnetic sensors based on PHE usually use patterned magnetic films with effective single domain behavior. This is usually achieved by growth-induced magnetic anisotropy, either by growing the film in a magnetic field or by exchange biasing the film with an antiferromagnetic layer. These methods yield a single easy axis of magnetization that aligns the magnetization with the current when no field is applied. When a field perpendicular to the easy axis (in the film plane) is applied, the magnetization rotates uniformly and reversibly, with no hysteresis. The change in $\rho_{xy}$ due to this rotation is used to detect the magnitude of the component of the field which is perpendicular to the easy axis.

Shape anisotropy can be reliably used for achieving effective single domain behavior. Moreover, this method has unique advantages in the design of sensing devices based on the PHE. Shape induced anisotropy, typically using an elliptical sensing region, can be approximated analytically and single domain behavior can be induced over a very wide range of parameters, provided that the ratio of the axes of the ellipse is large enough.

A PHE sensor is usually fabricated so that in zero applied magnetic field, the magnetization is parallel to the excitation current, flowing along the sensor long axis. This can be achieved via growth-induced magnetic anisotropy, either by growing the film in an applied magnetic field or by exchange biasing the film with an antiferromagnetic layer. These methods yield a single easy axis of magnetization, and consequently, uniform magnetization and its coherent rotation, when an in-plane magnetic field is applied perpendicular to the sensor easy axis.

In the present invention, shape-induced anisotropy of elongated ellipses (see FIG. 2) is used to tailor the anisotropy field of a sensor, thereby tailoring the operational range of the sensor. The anisotropy field can be smaller than 10 Oe and higher than 100 Oe (see FIG. 9 hereinbelow). Low anisotropy fields yield higher field sensitivity; hence, better magnetic field resolution. However, a sensor is suitable for measuring only fields small relative to the anisotropy field. Therefore, if a wider operational range is required for a given application, higher anisotropy fields are more useful.

The sensor 100 has four terminals, two current-injecting terminals ($V_{x1}$ and $V_{x2}$), and two voltage-measuring terminals ($V_{y1}$ and $V_{y2}$), with the excitation current applied via the current-injecting terminals and the output voltage measured across the voltage-measuring terminals.

To form the sensors (100), Permalloy ($Ni_{80}Fe_{20}$) films capped with tantalum are sputtered on Si substrates in a UHV evaporation and sputtering system (BESTEC). The elliptical sensing region (110) is patterned using photolithography using either lift-off or $Ar^+$ milling.

In addition to Permalloy, any soft magnetic material with a high enough anisotropic magnetoresistance can be used. Such materials include, but are not limited to alloys comprising elements selected from a group consisting of: Ni, Co, Fe, Cr, and N.

The tantalum may be replaced by other layers with resistance much higher than the resistance of the magnetic layer. It can be a conductor with high resistance (e.g., Ti, Cr) or an insulator (e.g., SiO, $Al_2O_3$), Leads and contact pads are deposited in a second stage. Lead and contact pad materials can be any suitable conductor. Lead and contact pad materials include, but are not limited to gold, tantalum, silver, copper, aluminum, and any combination thereof.

In preferred embodiments, either gold or tantalum is used. Using tantalum instead of gold enables use of wider contact pads which decreases 1/f noise; however, this increases the voltage leads' resistance, which also increases the related noise. Contact pads can have multiple-layers. For non-limiting example, a tantalum layer to enable a wider contact pad, with a gold layer to reduce related noise (see Example 2, hereinbelow).

The elongated ellipses have an aspect ratio of long (major) axis a to short (minor) axis b of a/b>6, since such elongated ellipses behave as single magnetic domain particles with effective anisotropy field along the long axis even in relatively large ellipses with long axes in the millimeter range. Although it becomes more challenging as the probability of detrimental film imperfections in the ellipse increases with size. The single magnetic domain behavior keeps the sensor gain stable and reproducible over time and also considerably reduces its 1/f noise.

The sensor need not be elliptical. Other possible shapes include, but are not limited to, ovals, rectangles, fillet rectangles, elongated hexagons, elongated octagons, elongated decagons, and any combination thereof.

It should be noted that, for sensors with aspect ratio a/b>6, the sensors disclosed herein behave as effectively single magnetic domains.

Sensor Theory

The sensing element in the sensors disclosed herein is made of an elliptically shaped magnetic film which behaves for specific range of parameters as an effectively single magnetic domain particle with the easy magnetic axis parallel to the long axis of the ellipse. The behavior of a single magnetic domain particle is described by the Stoner-Wohlfarth Hamiltonian, $\mathcal{H}$, $$\mathcal{H} = K_u \sin^2 \theta - M_s H \cos(\phi - \theta) \tag{3}$$

where $M_s$ is the saturation magnetization of the material of the sensing region, $K_u$ is the magnetic anisotropy constant, $\theta$ is the angle between $M_s$ and the easy axis, and $\phi$ is the angle between the external magnetic field H and the easy axis.

The field at which single magnetic domains are expected to switch ($H_s$) depends on the angle $\phi$ at which the field is applied relative to the easy axis according to $$H_s(\varphi) = \frac{H_k}{[\sin^{2/3}\varphi + \cos^{2/3}\varphi]^{3/2}}, \tag{4}$$

where $H_k$ is the anisotropy field defined as $2K_u/M_s$.

In the sensors disclosed herein $H_k$ is determined by shape and size due to the demagnetization factors. For ellipsoids, one can define and calculate demagnetization factors, which have the following form in the limit a≥b>>c:

$$\frac{N_a}{4\pi} = \frac{c}{a}(1-e^2)^{1/2}\frac{K-E}{e^2}, \tag{5}$$

$$\frac{N_b}{4\pi} = \frac{c}{a}\frac{E-(1-e^2)K}{e^2(1-e^2)^{1/2}}, \tag{6}$$

$$\frac{N_c}{4\pi} = 1 - \frac{cE}{a(1-e^2)^{1/2}}, \tag{7}$$

where a, b, and c are the axes of the ellipsoid. $N_a$, $N_b$, and $N_c$ are the demagnetizing factors (corresponding to a, b, and c respectively). K is a complete elliptic integral of the first kind and E is a complete elliptic integral of the second kind, whose argument is $e=(1-b^2/a^2)^{1/2}$. The behavior of the sensors when H is applied in the ab plane can be described by the Stoner-Wohlfarth Hamiltonian where the anisotropy constant $K_u$ is given by $$K_u = (1/2)M_s^2(N_b - N_a).$$

In the limit a>>b>>c, the axis length c is replaced by a thickness t and, from the asymptotic expansions of K and E, $H_k$ can be obtained from $$H_k \approx 4\pi M_s \frac{t}{b} \tag{8}$$

A comparison of the analytical approximation with the experimental results is described in Example 2 (see FIG. 9 hereinbelow). It should be noted that the experimental value of $H_k$, unlike the theoretical value, has a lower bound. This is due to the effect of the intrinsic anisotropy of the permalloy film, which is growth dependent and usually varies between 5 and 10 Oe. Comparison of the analytical approximation with OOMMF simulations shows that the approximation in Eq. (8) is quite good for a/b≥8.

Simulations for ellipses and rectangles have found that the analytical approximation is better for elongated ellipses.

The simulations also indicate the effective single domain behavior for ellipsoids and ellipses in a very wide range of sizes, whereas rectangular samples are much less stable. The ellipses with axis ratios of 6:1 and above behave quite like a single domain particles and the behavior improves with increasing axis ratio.

Surprisingly, the single-domain-like behavior is observed even for very large ellipses (see Example 2 below). This has a practical importance since the big ellipses have a very small $H_k$, which means that their magnetic field sensitivity (gain) per current=$(V_{PHE}/I)(1/H\perp)\propto 1/H_k$ is higher. Here, $V_{PHE}$ is the measured transverse voltage, I is the current through the sensor, H⊥ is the field applied perpendicular to the easy axis. We have obtained $H_k$ as small as 8 Oe and magnetic field sensitivity per current as large as 200Ω/T.

The field sensitivity, the ratio between the measured output voltage and the field, of a PHE sensor when the magnetic field applied perpendicular to the easy axis of magnetization is smaller than the magnetic anisotropy can be expressed as follows:

$$S_y = \frac{V_y}{B} = 10^4 \frac{V_x}{R_x} \cdot \frac{\Delta\rho}{t} \cdot \frac{1}{H_k + H_a} \tag{9}$$

where $V_y$ is the sensor output voltage, measured across the voltage-measuring terminals, B is the applied magnetic field, $V_x$ is the bias voltage across the current-measuring terminals, $R_x$ is the sensor resistance across the current-measuring terminals, $\rho$ is the sensor average electrical resistivity, t is the sensor thickness, $H_k$ is the sensor shape induced anisotropy field, and $H_a$ is the intrinsic anisotropy field. The total noise of a PHE sensor has three main components: 1/f noise, thermal noise, and preamplifier noise (see FIG. 3, hereinbelow).

$$e_\Sigma = \sqrt{V_x^2 \frac{\delta_H}{N_C \cdot Vol \cdot f^a} + 4k_H TR_y + e_{amp}^2} \tag{10}$$

where $\delta_H$ is the Hooge constant [Gijs 1997], $N_C$ is the "free" electron density, equal to $1.7 \times 10^{29}$ 1/m$^3$ for Ni$_{80}$Fe$_{20}$ Permalloy, Vol is the effective volume, where the electrons are contributing to the conduction process in a homogeneous sample, f is the frequency, $\alpha$ is a constant, $k_B$ is the Boltzmann constant, T is the temperature, $R_y$ is the sensor resistance across the voltage-measuring terminals, and $e_{amp}$ is the total preamplifier noise, referred to its input (including the voltage noise, current noise, and the noise of the resistors).

The sensor equivalent magnetic noise is defined as $$B_{eq} = \frac{e_\Sigma}{S_y}. \qquad (11)$$

For sufficiently low f and high $V_x$, the 1/f noise in (4) dominates, and the other noise components can be neglected. Consequently $$B_{eq} = \sqrt{\frac{\delta_H}{N_C \cdot Vol \cdot f^\alpha}} \frac{(H_k + H_a) \cdot t \cdot R_x}{10^4 \cdot \Delta\rho}. \qquad (12)$$

For our elliptical sensors, in the limit, a>>b>>t $$H_k \approx 4\pi M_s \frac{t}{b} \qquad (13)$$

For these sensors, t<<a, b, d, and e (see FIG. 2, below), and $R_x$, Vol, and $R_y$, can be approximated by eqs. (9), (10) and (11). Parameter d gives the distance between the current-measuring ($V_x$) terminals, and e gives the width of the voltage-measuring ($V_y$) terminals in the region of overlap with the ellipse.

$R_x$ can be approximated by $$R_k = \frac{C_1 \cdot \rho \cdot d}{t \cdot b} \qquad (14)$$

where $C_1$ is typically a constant not much larger than 1. Assuming that the relevant volume for Vol is an effective volume that contributes to the measured transverse voltage $V_y$, Vol and $R_y$ can be approximated by $$Vol = C_2 \cdot t \cdot b \cdot e \qquad (15)$$

$$R_y = \frac{C_3 \cdot \rho \cdot b}{t \cdot e \cdot C_2} \qquad (16)$$

where $C_3$, similarly to $C_1$, is a constant not much larger than 1. These constants are due to the interface resistance between the lead film and the sensor film, which increases the total value of $R_x$ and $R_y$. $C_2$ is a constant larger than 1 that relates the real, substantially rectangular solid shaped volume between the y-terminals to the effective conduction volume.

It should be noted that, in this analysis, $H_a$, $\Delta\rho/\rho$, and $\rho$ are treated as constants, which is justified for the range of thicknesses relevant for the sensors disclosed herein.

Eq. (12) represents the minimum equivalent magnetic noise, because increasing $V_x$ increases the magnetic field sensitivity in (8) and also, as mentioned previously, the 1/f noise in (10) relative to the sensor thermal noise and the noise of the preamplifier, thus making them negligible.

By substituting (12)-(14) into (11), we obtain $$B_{eq} = \frac{(4\pi M_s t + b H_a) \cdot C_1 \cdot d \cdot \rho}{10^4 \cdot \Delta\rho \cdot b^2} \sqrt{\frac{\delta_H}{N_C \cdot C_2 \cdot t \cdot b \cdot e \cdot f^\alpha}} \qquad (17)$$

It is important to note that the equivalent magnetic noise in (16) depends only on the sensor dimensions and the material properties.

The optimal sensor thickness $t_{opt}$ that minimizes (16) is $$t_{opt} = \frac{H_a \cdot b}{4\pi M_s} \qquad (18)$$

Interestingly, for this thickness $$H_k \approx H_a. \qquad (19)$$

Typically, for obtaining high magnetic field resolution $t_{opt}$ is in the range from about 50 nm to 300 nm, although optimal thicknesses can be in a range from 10 nm to 1 μm.

By substituting (17) into (16), we obtain the sensor low frequency equivalent magnetic noise $B_{min}$ at the optimal thickness $$B_{min} = \frac{\sqrt{4\pi M_s}}{10^4} \frac{2\sqrt{H_a} \cdot C_1 \cdot d \cdot \rho}{\Delta\rho \cdot b^2} \sqrt{\frac{\delta_H}{N_C \cdot C_2 \cdot e \cdot f^\alpha}} \qquad (20)$$

Guided by the minimization of $B_{min}$ in Eq. 20, the parameters d and e can be determined (see Example 1).

EXAMPLE 1

Figure 2:
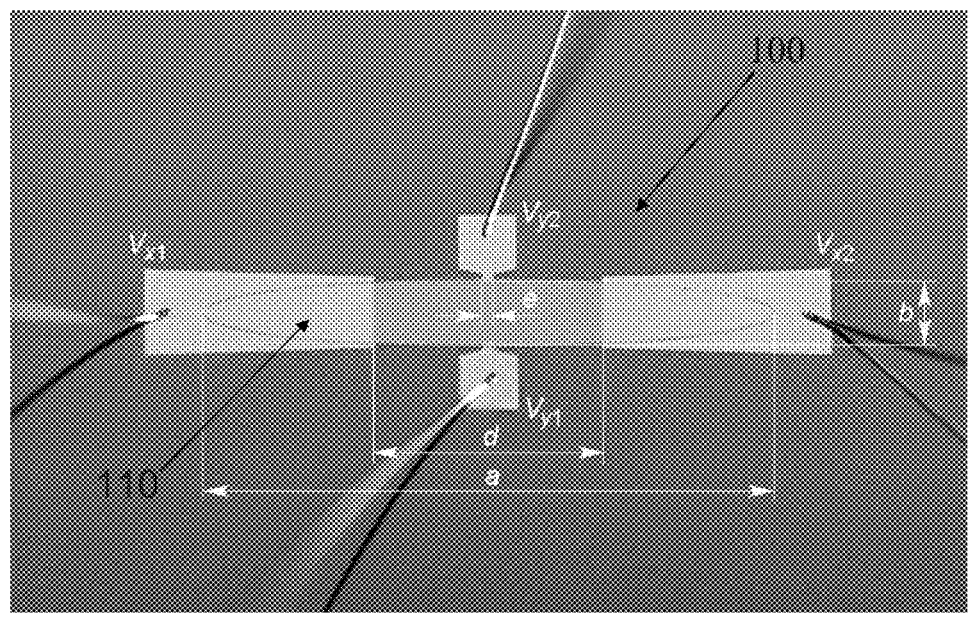
FIG. 2 depicts an embodiment of a PHE sensor.

PHE sensors were fabricated with aspect ratio a/b=8 (see FIG. 2). In principle, larger sensors are favorable for better magnetic field resolution. The chosen dimensions are determined according to the capability to fabricate large ellipses without any detrimental imperfections. Accordingly, the sensors were fabricated with a=3 mm. The distance d between the current-injecting terminals ($V_x$ terminals) should be as small as possible to decrease the resistance $R_x$. On the other hand, if the leads are too close together, a significant part of the current would flow through the voltage-measuring leads instead of flowing through the magnetic layer, which would decrease significantly the PHE signal. Therefore, d was chosen to be d=1.2 mm and d/e=20.

In this embodiment, each terminal comprises a contact pad and a lead. Gold contact pads and gold leads were used. The magnetic film is made of permalloy (Ni$_{80}$Fe$_{20}$).

The sensor parameters are listed in Table 1. The values of $\Delta\rho/\rho$, $\rho$, and $H_a$ were determined by measurement.

TABLE 1

Parameters of the optimized PHE sensor experimental model.

| Parameter | Value | Units | Parameter | Value | Units |
|---|---|---|---|---|---|
| a | 3 | mm | $H_a$ | 3.84 | Oe |
| b | 0.375 | mm | $H_k$ | 3.45 | Oe |
| c | 120 | nm | $\Delta\rho/\rho$ | 1.6 | % |

TABLE 1-continued

Parameters of the optimized PHE sensor experimental model.

| Parameter | Value | Units | Parameter | Value | Units |
|---|---|---|---|---|---|
| d | 1.2 | mm | ρ | $2.7\ 10^{-7}$ | Ohm · m |
| e | 0.06 | mm | α | 1.5 | |
| $R_x$ | 9.97 | Ohm | δH | $2.73\ 10^{-3}$ | |
| $R_y$ | 5.08 | Ohm | $N_e$ | $17\ 10^{28}$ | $1/m^3$ |
| $I_x$ | 71.4 | mA | | | |

The parameter a for these sensors gives the full length of the ellipse along its long (X-direction) axis, while the parameter b gives the full width of the ellipse along its short (Y direction) axis. t is the thickness of the elliptical region. Parameter d gives the distance between the current-measuring ($V_x$) terminals, and e gives the width of the voltage-measuring ($V_y$) terminals in the region of overlap with the ellipse.

Figure 3:
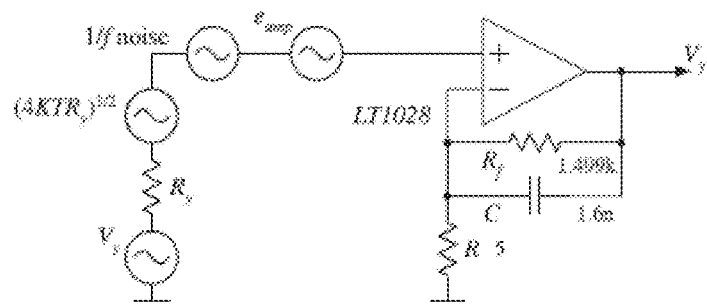
FIG. 3 illustrates an equivalent electrical circuit of an embodiment of the PHE sensor.

In reference to FIG. 3, an equivalent circuit for the test setup is shown, showing the noise sources, including the source of 1/f noise. Thermal noise will arise from all components, and preamplifier noise arises in the LT1028 preamplifier.

The sensor was excited with AC current. The sensor output was amplified using a low-noise operational amplifier (LT1028). The amplifier output was sampled by a 24-bit ADC (PXI-5421) and demodulated using a digital synchronous detector. A 100-Hz low-pass filter at the output of the synchronous detector was used to band limit the signal.

As the input voltage noise of the LT1028 operational amplifier flattens at around 1 kHz, the sensor was excited at a frequency of 1.22 kHz to avoid the amplifier 1/f noise and 50-Hz power network harmonics.

The sensor field sensitivity (gain) $S_y$ was measured using a calibrated solenoid and was found to be flat from 10 mHz to 100 Hz.

The sensor noise was measured by using a seven layer magnetic shield to suppress low-frequency interferences. To find the optimal excitation current, it was changed by small steps, measuring the sensor gain and noise at each step.

Theoretically, if the sensor power consumption is not limited, the excitation current should be as high as possible to bring the equivalent magnetic noise to a minimum at all frequencies. However, the ability of the sensor to dissipate the excessive heat is limited and, therefore, at a too high current, the sensor becomes thermally unstable, which degrades its equivalent magnetic noise.

From eq. (14), the known values of ρ, d, t, and b, and the measured values of $R_x$, $C_1$ was found to be $C_1$=1.38.

From simulations performed using COMSOL software, with $R_y$ according to eq. (16), it was found that $C_2$=4.23. In these simulation, because the simulation does not consider the interface resistance between the gold and Permalloy films, $C_3$ was assumed to be $C_3$=1.

Then, by substituting $C_2$ into eq. (16) and comparing it to the measured value of $R_y$, $C_3$ was determined to be $C_3$=1.53.

Figure 4:
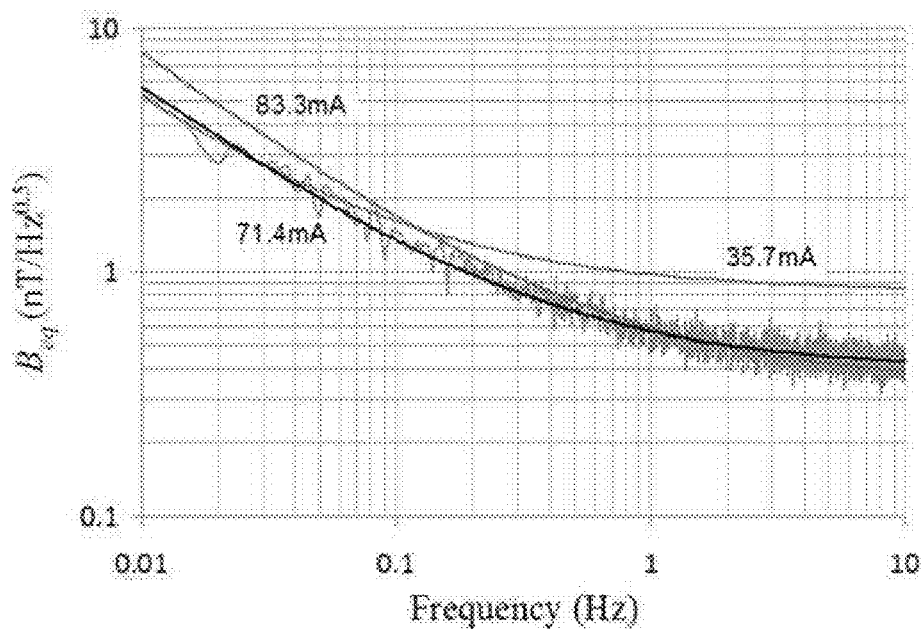
FIG. 4 illustrates equivalent magnetic noise versus frequency for an embodiment of a PHE sensor.

FIG. 4 shows the sensor equivalent magnetic noise versus frequency for the case of too low (35.7 mA), optimal (71.4 mA), and too high (83.3 mA) excitation currents, $I_x$. For the optimum excitation current amplitude of 71.4 mA, both the sensor noise and the noise fit are shown. For other excitation current amplitudes only the noise fits are shown.

The measured equivalent magnetic noise $B_{eq}$ in nT/√Hz is fitted as follows:

$$B_{eq} = a_0 + a_1 \cdot \frac{1}{f^{0.75}} \quad (21)$$

with $a_0$=0.83 and $a_1$=0.14 for $I_x$=35.7 mA; $a_0$=0.4 and $a_1$=0.17 for $I_x$=71.4 mA; $a_0$=0.35 and $a_1$=0.24 for $I_x$=83.3 mA.

It can be seen from FIG. 4 that the sensor equivalent magnetic noise at the optimal excitation current is either the lowest one or does not practically differ from the noise values at the other excitation currents. A too low excitation current provides similar results at low frequencies but worse results at higher frequencies, where the 1/f noise is not so dominant. At a too high excitation current, the equivalent magnetic noise at high frequencies is similar to that of the optimal current, but is degraded at low frequencies due to thermal drift.

From the obtained results for the optimal current, the Hooge constant was estimated to be $δ_H$=2.73×10$^{-3}$. This value differs only by 36% from the so called "Hooge magic number" of 2×10$^{-3}$ which has been reported as the Hooge constant for single layer metal films in general, and magnetic films in particular.

At least three additional identical sensors have been built and tested and their noise and magnetic field resolution do not differ by more than 10% from the sensor described previously.

The white noise components, e.g., thermal and preamplifier noise, degrades the sensor optimal equivalent magnetic noise by 40% at 0.1 Hz, 300% at 1 Hz, and more than 1000% at 10 Hz. Although our preamplifier has a very low noise of 1 nV/√Hz, it is still three times larger than the thermal noise of the sensor (0.29 nV/√Hz). Therefore, it is expected that using a lower noise preamplifier will effect a significant improvement in the equivalent magnetic noise, especially at higher frequencies. Further improvement in the equivalent magnetic noise is possible due to the following. The highest Δρ/ρ value for our sensors is about 1.6%, which may be increased up to 4% by using an insulation layer, consisting of a thermal silicon dioxide or a low stress silicon nitride deposited by a PECVD process at low temperatures. Ferromagnetic nitride films exhibiting Δρ/ρ on the order of 6% can also be considered. Increasing Δρ/ρ by a factor of 2 and decreasing $H_a$ by a factor of 5 is expected to improve the equivalent magnetic noise by a factor of 4.5.

These sensors showed a magnetic field resolution of 570 pT/√Hz at 1 Hz, 3.5 times better than the best results previously reported for the PHE sensors. Below about 0.2 Hz, the resolution is also better than the resolution of the best AMR sensors known in the art.

Figure 5:
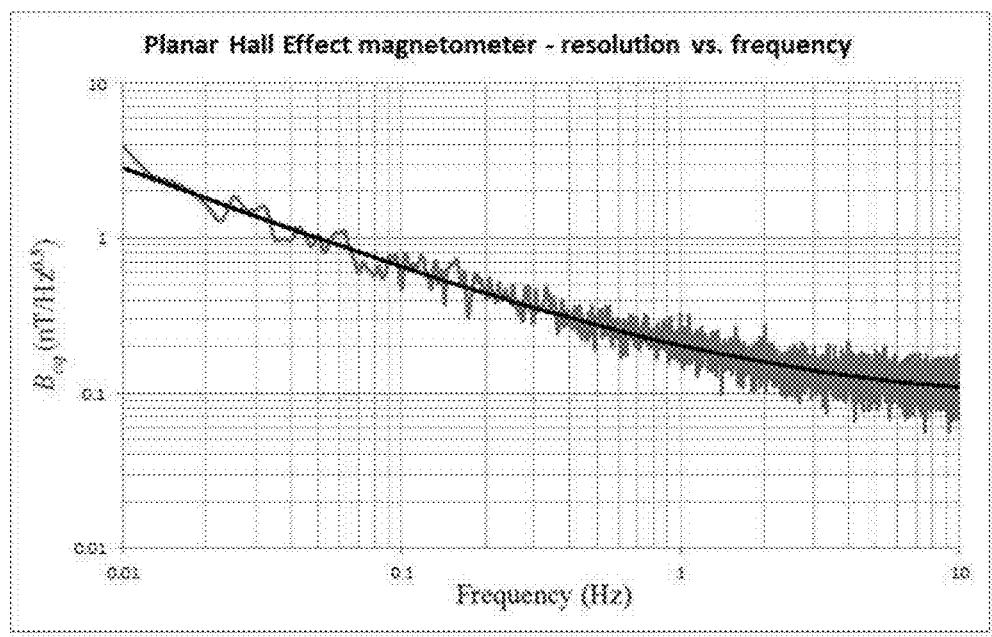
FIG. 5 illustrates equivalent magnetic noise versus frequency for an embodiment of a PHE sensor.

FIG. 5 shows magnetic field resolution versus frequency of another sensor made with the same magnetic layer with a similar structure which exhibits improved magnetic field resolution The magnetic field resolution is better than 1 nT/√Hz at 0.1 Hz and better than 0.3 nT/√Hz at 1 Hz. These results further highlight the high potential of our PHE sensors.

EXAMPLE 2

Figure 6:
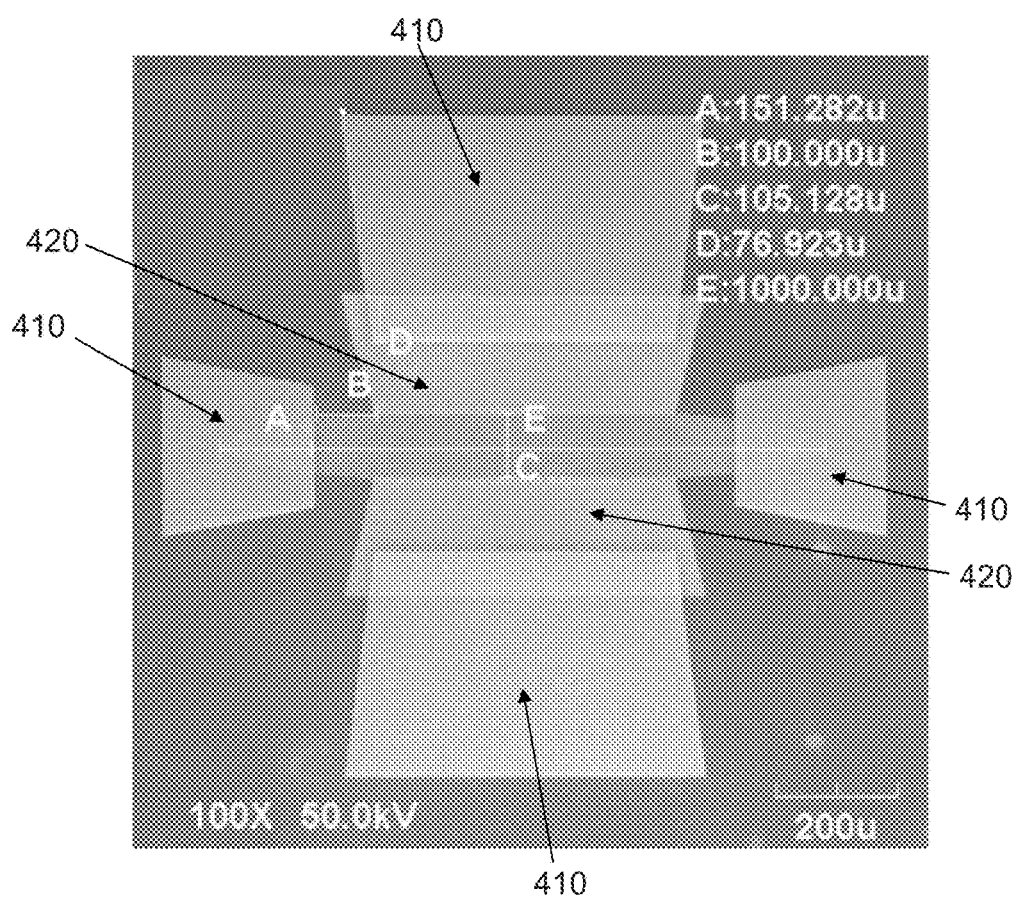
FIG. 6 illustrates a scanning electron microscope image of a another embodiment of a PHE sensor.

FIG. 6 shows a scanning electron microscope image of a typical PHE sensor as used in this embodiment. The elliptical part is made of permalloy (the same as in Example 1) capped with tantalum.

Current is driven along the long axis through gold contact leads (410) overlapping the magnetic ellipse. Voltage is measured via the tantalum pads (420) overlapping the ellipse and gold pads (410) overlapping the tantalum pads.

In this embodiment, the use of tantalum for voltage pads enables a contact pad significantly wider than that of Example 1. The use of gold pads on top of the tantalum pads reduces the resistance and the resulting noise.

The parameter A for these sensors gives the distance the current-injecting (X) gold contact pad extends into the ellipse, while the parameter B is the horizontal (X) distance from the edge of a voltage-measuring tantalum contact pad to the edge of a current-injecting (X) contact pad. C gives the distance between the opposite voltage-measuring (Y) tantalum contact pads, while D gives the distance the gold voltage-measuring (Y) lead extends into the voltage-measuring contact pad and E gives the length of the long (major) axis of the ellipse.

Using sensors with parameters as shown in Table 2,

TABLE 2

Parameters of the optimized PHE sensor experimental model.

| Parameter | Value | Units |
| --- | --- | --- |
| A | 151.282 | μm |
| B | 100 | μm |
| C | 105.128 | μm |
| D | 76.923 | μm |
| E | 1000 | μm |

Figure 7:
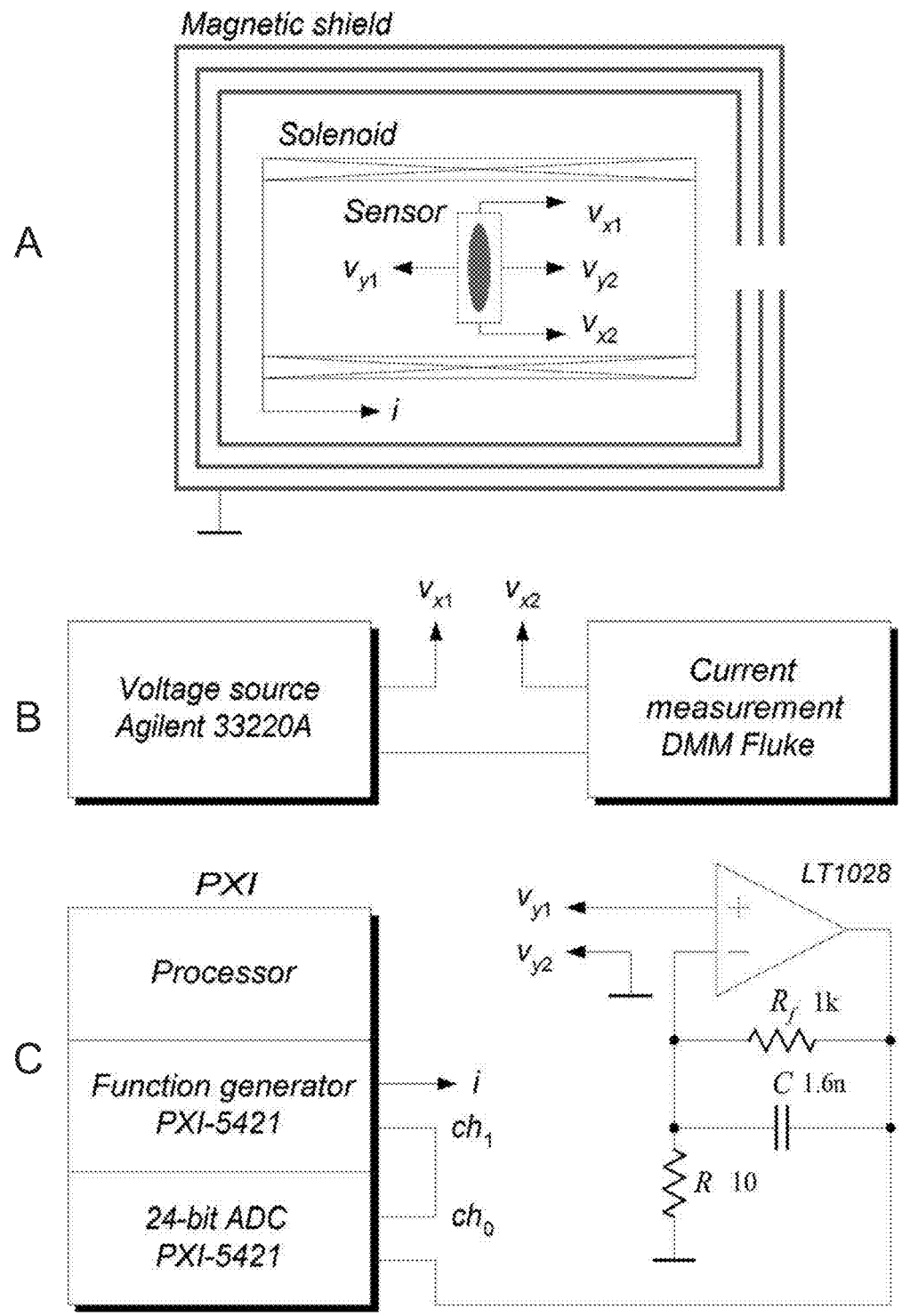
FIG. 7 illustrates an embodiment of an experimental setup for measuring the magnetic field resolution of a PHE sensor.

Response measurements are performed using a Helmholtz coils system with a rotating sample stage having an angular resolution of 0.03°. The sample is connected electrically to a switch box (Keithley 7001), a current source (Keithley 2400), and a nanovoltmeter (Keithley 2182). Magnetic field resolution (equivalent magnetic noise) measurements are performed at 1 Hz with the experimental setup shown in FIG. 7, which shows an experimental setup for measuring the sensor magnetic field resolution. The setup includes a three-shell magnetic shield, a voltage source, a current measurement instrument (to apply a bias), a preamplifier, and a National Instruments personal computer-based platform for test, measurement, and control (PXI).

FIG. 7A schematically illustrates the experimental setup, showing the sensor, the solenoid which provides the test magnetic field, and the three-layer magnetic shield.

FIG. 7B schematically illustrates the Agilent 33220A voltage source and the DMM fluke current measurement device and their electrical connections to each other Voltage $V_{x1}$ and voltage $V_{x2}$ are applied as shown in FIG. 7A.

Figure 8:
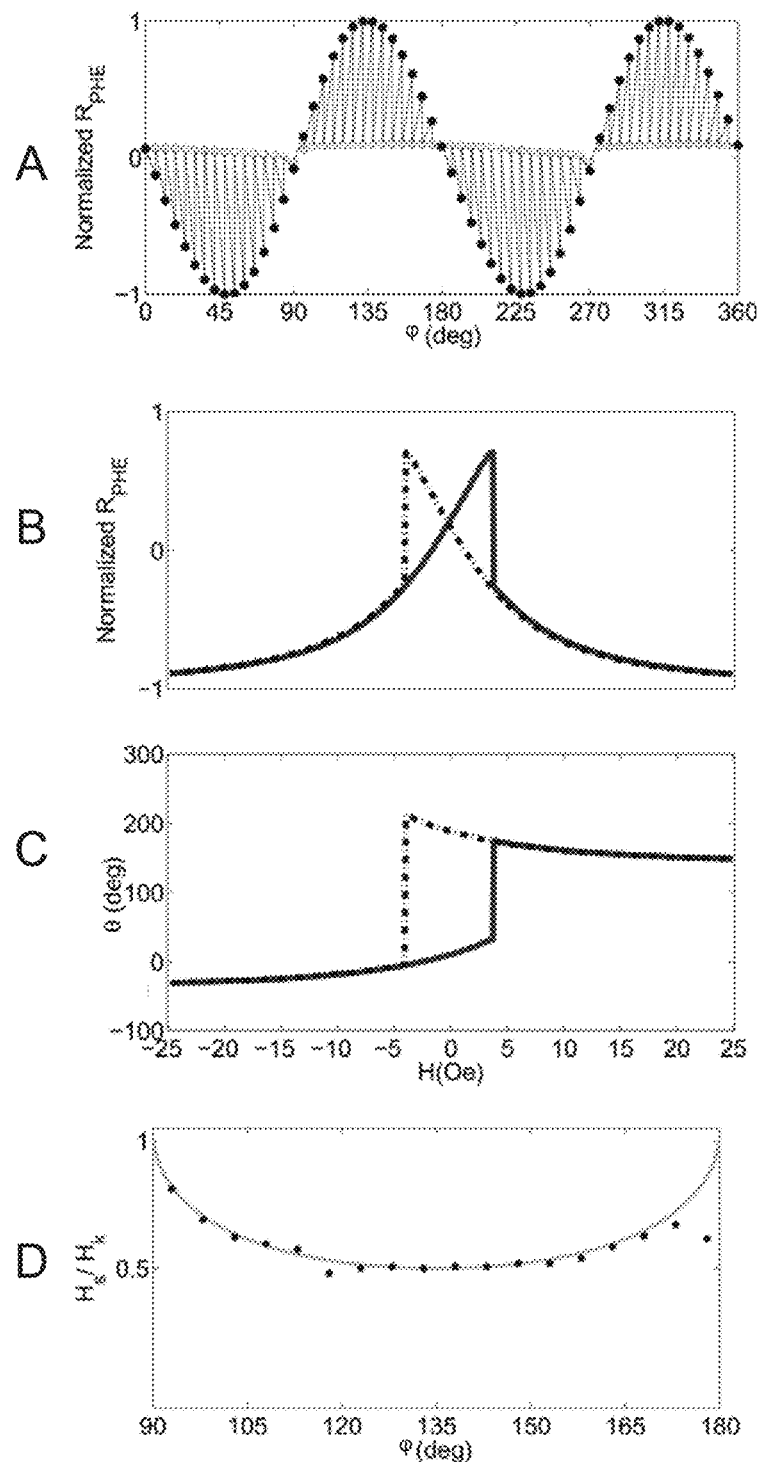
FIG. 8 illustrates the effective single-domain behavior of an embodiment of large elliptical sensors.

FIG. 7C schematically illustrates a circuit diagram for the voltage measurement terminals $V_{y1}$ and $V_{y2}$ FIG. 8 presents two types of experiments that demonstrate the effective single domain behavior of the elliptical sensors. FIG. 8A shows normalized PHE measured across an elliptical sensor as a function of the angle ϕ between H and I (see FIG. 1). The dimensions of the ellipse are 2 mm length, 0.25 mm width, and 60 nm thickness, and I is applied along its long axis. For each angle ϕ, the voltage is measured twice: with H=100 Oe (filled circles) and with H=0 (open circles). The voltage measured in the latter case indicates that for each angle ϕ, M fully returns to the easy axis, and the variations in the zero-field signals are consistent with the expected effect of a small ambient field.

FIG. 8B shows the PHE as a function of H at an angle ϕ=130° for an elliptical sensing region with dimensions 1 mm length, 0.125 mm width, and 60 nm thickness.

The figure shows a sharp switching behavior of the measured PHE as a function of H. This type of behavior indicates effective single domain behavior with effective uniaxial anisotropy along the long axis of the ellipse, which is usually described by the Stoner-Wohlfarth Hamiltonian, $\mathcal{H}$, $$\mathcal{H} = K_u \sin^2 \theta - M_s H \cos(\phi - \theta) \qquad (22)$$

where $M_s$ is the saturation magnetization of the material of the sensing region, $K_u$ is the magnetic anisotropy constant, θ is the angle between $M_s$ and the easy axis, and ϕ is the angle between the external magnetic field H and the easy axis.

FIG. 8C shows the corresponding θ for the measurements shown in FIG. 8B.

FIG. 8D shows the switching field divided by $H_k$ as a function of ϕ. The line is a fit to the Stoner-Wohlfart model.

$$H_s(\varphi) = \frac{H_k}{[\sin^{2/3}\varphi + \cos^{2/3}\varphi]^{3/2}}, \qquad (23)$$

where $H_k$ is the anisotropy field defined as $2K_u/M_s$. It should be noted that, for ϕ close to 180°, the experimental points deviate from the theoretical prediction, indicating that in this narrow range of angles the magnetization reversal cannot be described in terms of coherent rotation. This, however, does not affect the functionality of our sensors, which are used to detect fields much smaller than the anisotropy field.

To determine the effective $H_k$ of our sensors, a small field is applied perpendicular to the easy axis and the slope of θ versus H⊥ is measured. FIG. 9 represents the experimentally extracted $H_k$ for elliptical sensors in a wide range of sizes as a function of c/b, where c is the film thickness and b is the short axis of the ellipse. The diamonds represent the experimental data, the dots represent simulated data for ellipses, while the line represents the theoretical anisotropy field of ellipsoids (Eq. (8)).

As noted above, in the limit a>>b>>c, where c=t is the thickness of the sensing region, from the asymptotic expansions of K and E, $H_k$ can be obtained from $$H_k \approx 4\pi M_s \frac{t}{b} \qquad (24)$$

where $M_s$, t and b are as defined hereinabove.

For a sensor where the sensing region is Permalloy, $H_k$ becomes $$H_k \sim 4\pi M_s \frac{c}{b} \sim 10,807 \frac{c}{b} Oe. \qquad (25)$$

Figure 9:
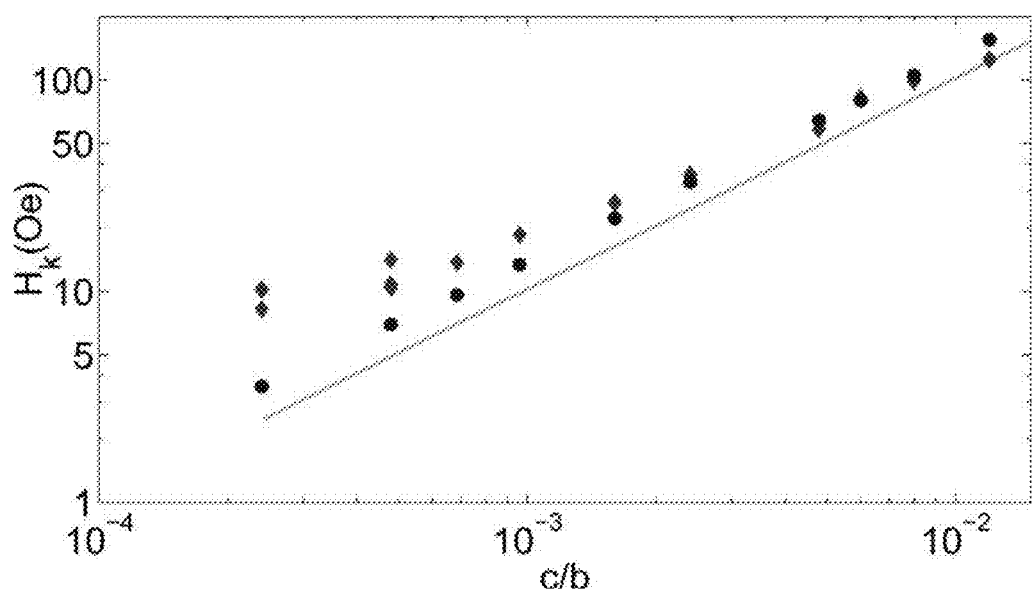
FIG. 9 illustrates a comparison of experimental, theoretical and simulated shape anisotropy field $H_k$ for ellipses as a function of the axis ratio c/b.

A comparison of the analytical approximation with the experimental results is shown in FIG. 9. It should be noted that the experimental value of $H_k$, unlike the theoretical value, has a lower bound. This is due to the effect of the intrinsic anisotropy of the permalloy film, which is growth dependent and usually varies between 5 and 10 Oe. Comparison of the analytical approximation with OOMMF simulations shows that the approximation in Eq. (8) is quite good for a/b≥8.

Simulations for ellipses and rectangles have found that the analytical approximation is better for elongated ellipses.

The simulations also indicate the effective single domain behavior for ellipsoids and ellipses in a very wide range of sizes, whereas rectangular samples are much less stable. The ellipses with axis ratios of 6:1 and above behave quite like a single domain particles and the behavior improves with increasing axis ratio.

Surprisingly, the single-domain-like behavior is observed even for very large ellipses. This has a practical importance since the big ellipses have a very small $H_k$, which means that their field sensitivity per current $(V_{PHE}/I)(1/H\perp) \propto 1/H_k$ is higher. Here, $V_{PHE}$ is the measured transverse voltage, I is the current through the sensor, $H\perp$ is the field applied perpendicular to the easy axis. We have obtained $H_k$ as small as 8 Oe and field sensitivity per current as large as 200Ω/T.

The magnetic field resolution of our sensors is determined using the setup described above for FIG. 7. First, the magnetic field sensitivity of the sensor is measured. Second, the amplitude spectral density of the noise is measured, and then the noise spectral density is translated into the magnetic field resolution threshold by dividing the noise spectral density by the magnetic field sensitivity.

To measure the magnetic field resolution, an external magnetic field is applied by means of a long solenoid connected to a function generator, the sensor is biased with a voltage source, the sensor output is amplified by an ultra-low noise preamplifier, and the preamplifier output is sampled by a 24 bit analog to digital convertor. The amplifier noise is negligible compared to the 1/f noise of the sensor at a given AC bias current, and there is no need to use either Wheatstone Bridge or cross-correlation techniques. All the measurements are performed in a three-layer magnetic shield. Using this setup, we find that our best sensors have, at 1 Hz, a magnetic field resolution of about 0.6 nT√Hz.

It should be possible to further reduce $H_k$ by more than an order of magnitude, which would increase S accordingly. In addition, a flux concentrator can be used to amplify the measured field. (See F. N. Van Dau et al., The 8th International Conference on Solid-State Sensors and Actuators, and Eurosensors IX, Transducers '95, Stockholm, Sweden, Jun. 25-29, 1995, p. 292.) Therefore, it appears likely that further improvement of the magnetic field resolution by orders of magnitude is within reach.

Multiple Sensors on a Chip

The following disclosure will refer to the sensors disclosed hereinabove. The sensors disclosed hereinabove can be very useful for applications not only for their excellent magnetic field resolution but also because they offer the possibility of fabricating, as a single device, on a single substrate, multiple sensors with a wide range of $H_k$ along different directions—features that open new opportunities for PHE sensors.

One embodiment of a multiple-sensor device has sensors with their long axes oriented in different directions; having different orientations. Such a device can simultaneously measure the two components of the magnetic field in the plane of the substrate. For a multiple-sensor device with two sensors, the preferred orientations of the long axes would be perpendicular to each other.

Another embodiment of a multiple-sensor device has sensors of different sizes. Although, it is particularly simple to make such a device with all the sensors having the same thickness, it is not a requirement. Between any two sensors, at least one of the following can be different: ratio of length of the sensing region to width of the sensing region, length of the sensing region, width of the sensing region, thickness t of sensing region, width of current-injecting contact pad, width of voltage-measuring contact pad, distance the current-injecting contact pad extends into the sensing region, and any combination thereof. Typically, the thickness t of the sensing region will be selected so as to minimize sensor noise and will depend, as described hereinabove, on the length and width of the sensing region and on the material properties of the sensing region.

Since the shape and size of a sensor determines its magnetic anisotropy, sensors with differing magnetic properties can form part of a single device.

For non-limiting example, a device can be constructed which is able to measure a wide range of magnetic field strengths. In such a device, sensors with differing anisotropies and, therefore, suitable for measuring different ranges of fields, would be used to measure magnetic fields of different field strengths, with the devices of smallest anisotropy measuring the smallest fields, while the devices of larger anisotropy measuring the larger fields.

In some variants of the above embodiments, the device can measure the two components of the magnetic field in the plane of the substrate over a wide range of magnetic field strengths, by including sensors of different sizes and with different long axis orientations.

Figure 10:
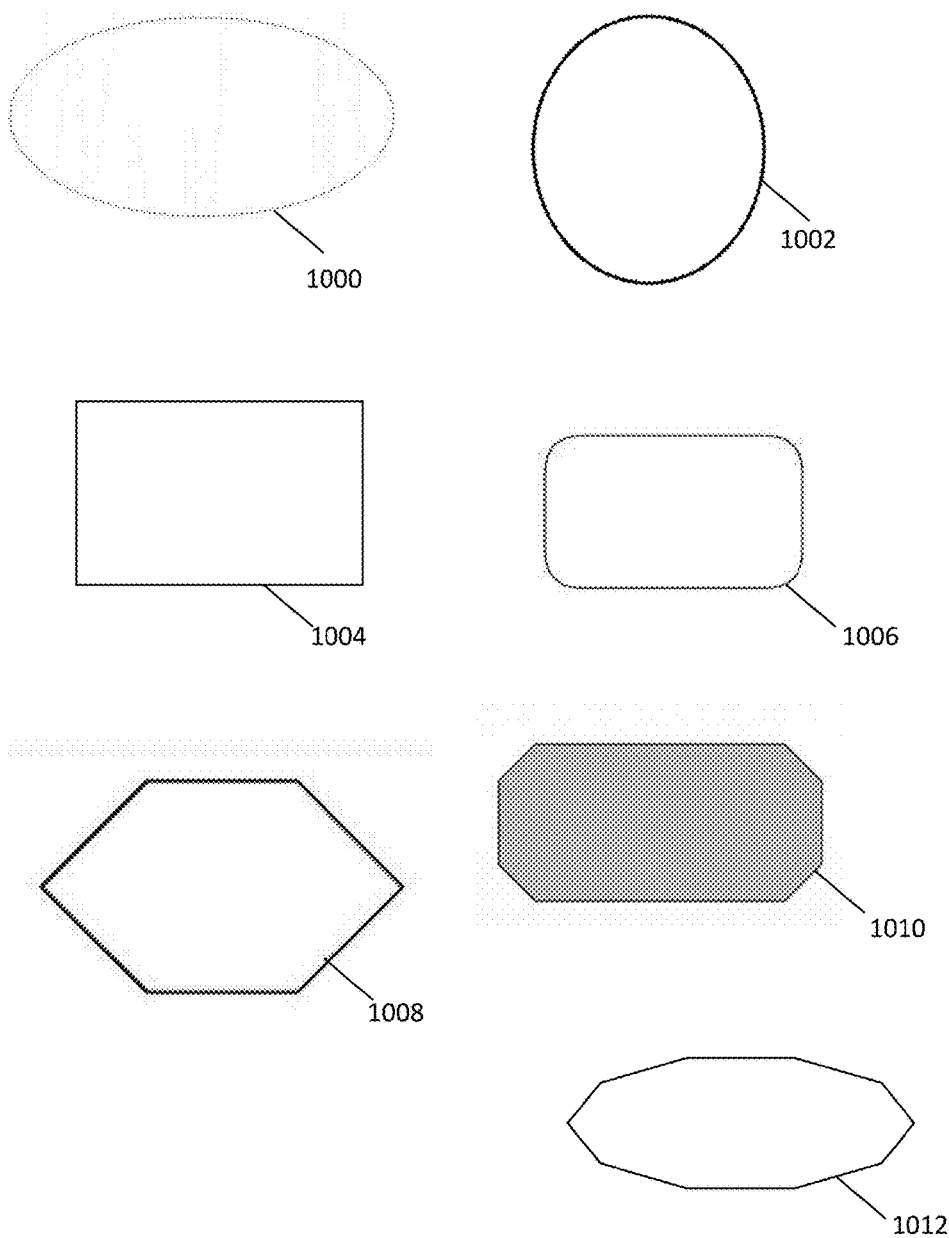
FIG. 10 illustrates an ellipse, an oval, a rectangle, a fillet rectangle, an elongated hexagon, an elongated octagon, and an elongated decagon.

FIG. 10 illustrates an ellipse 1000, an oval 1002, a rectangle 1004, a fillet rectangle 1006, an elongated hexagon 1008, an elongated octagon 1010, and an elongated decagon 1012.

Figure 11:
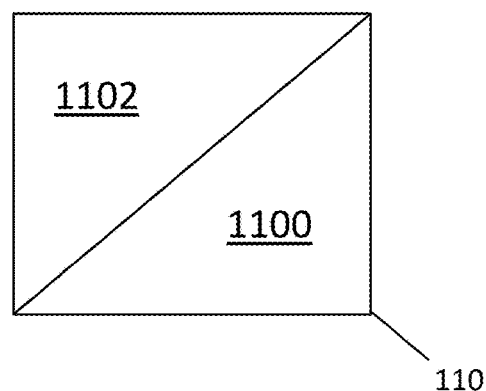
FIG. 11 illustrates a sensing region comprising magnetic and non-magnetic material.

FIG. 11 illustrates a sensing region 110 comprising magnetic 1100 and non-magnetic 1102 material.

Potential Appplications

The sensors of the present invention can be used directly, where the parameter of interest is the magnetic field, or indirectly, where the measured magnetic field can be related to the parameter of interest.

Examples of direct application include, but are not limited to:
a) Navigation
b) Magnetic anomaly detection, detection of objects that disturb the ambient magnetic field such as, for non-limiting example, mines, submarines, army vehicles, archeological sites and burial grounds.
c) Miniature sensor networks. An example of such sensor networks is "Smart Dust", a system of many tiny sensors distributed over some area and wirelessly connected to a computer.
d) Current meters to monitor consumption
e) Current distribution—to detect metal fatigue
f) Medical applications—for non-limiting example, measurement of heart activity, magnetic detection of biomolecules
g) HDD reading heads A non-limiting example of an indirect application is detection of the motion of an object to which a permanent magnet is attached, by means of which linear and rotational motion of the object can be detected and measured.

Such a detector would be useful as
a) An acceleration sensor.
b) A tilt sensor.
c) A speed sensor (magnitude only) or velocity sensor (magnitude and direction).
d) A position sensor independent of a GPS system.

Such a sensor would have applications in, for non-limiting example, the vehicle industry. In the foregoing description, embodiments of the invention, including preferred embodiments, have been presented for the purpose of illustration and description. They are not intended to be exhaustive or to limit the invention to the precise form disclosed. Obvious modifications or variations are possible in light of the above teachings. The embodiments were chosen and described to provide the best illustration of the principals of the invention and its practical application, and to enable one of ordinary skill in the art to utilize the invention in various embodiments and with various modifications as are suited to the particular use contemplated. All such modifications and variations are within the scope of the invention as determined by the appended claims when interpreted in accordance with the breadth they are fairly, legally, and equitably entitled.

The invention claimed is:

1. A planar Hall-effect sensor, comprising:
    a. two current-injecting terminals;
    b. two voltage measuring terminals; and
    c. a magnetic sensing region of an elongated shape, said shape characterized by:
        (a) an easy axis;
        (b) a long axis;
        (c) a short axis perpendicular to said long axis;
        (d) a thickness t;
        (e) two ends, each of which is electrically connected to one of said current-injecting terminal; and,
        (f) two sides, each of which is electrically connected to one said voltage measuring terminal;
    wherein n sensors are fabricated on a single substrate, n is an integer greater than or equal to two and at least two of said n sensors have differently oriented long axes so as to measure the two components of the magnetic field in the plane of a chip on which the sensor is fabricated.

2. The planar Hall-effect sensor of claim 1, wherein:
    (a) said elongated shape is substantially a shape selected from a group consisting of: an ellipse, an oval, a rectangle, a fillet rectangle, an elongated hexagon, an elongated octagon, an elongated decagon, and any combination thereof;
    (b) a ratio of length of said long axis to length of said short axis is greater than about 6;
    (c) said long axis is less than about 30 mm long;
    (d) said short axis is less than about 5 mm long; or
    (e) said thickness t of said sensing region is in a range from about 10 nm to about 1 µm;
    or
    any combination of (a) through (e).

3. The planar Hall-effect sensor of claim 1, wherein said sensing region comprises a soft magnetic material, said soft magnetic material selected from a group consisting of: permalloy, and alloys consisting of elements selected from a group consisting of: Ni, Co, Fe, Cr, N and any combination thereof.

4. The planar Hall-effect sensor of claim 3, wherein said sensing region comprises a non-magnetic material, said non-magnetic material capping said magnetic material, said non-magnetic material selected from a group consisting of: tantalum, Ti, Cr, SiO, Al$_2$O$_3$ and any combination thereof.

5. The planar Hall-effect sensor of claim 1, wherein said at least two of said n sensors have different anisotropies and are characterized by a difference in parameter selected from a group consisting of: said ratio of said thickness t to said length of said short axis, length of said long axis, said length of said short axis, and any combination thereof.

6. A method of using a planar Hall-effect sensor comprising steps of:
    a. providing a planar Hall-effect sensor comprising:
        i. two current-injecting terminals;
        i. two voltage measuring terminals; and
        ii. a magnetic sensing region, of an elongated shape, said shape characterized by:
            (a) an easy axis;
            (b) a long axis,
            (c) a short axis perpendicular to said long axis,
            (d) a thickness t;
            (e) two ends, each of which is electrically connected to one said current-injecting terminal, and
            (f) two sides, each of which is electrically connected to one said voltage measuring terminal;
    b. connecting said current-injecting terminals to a source of current;
    c. connecting said voltage measuring terminals to a means of measuring voltage;
    d. injecting an excitation current generated by said current source into said current-injecting terminals, said excitation current having a predetermined frequency; and
    e. measuring voltage induced between said voltage measuring terminals by said excitation current;
    wherein effective single domain magnetic behavior is exhibited in said sensing region, with shape-induced uniaxial magnetic anisotropy with said easy axis parallel to said long axis of said magnetic sensing region; further wherein the magnitude of said uniaxial magnetic anisotropy depends on said ratio of said thickness t to length of said short axis.

7. The method of claim 6, additionally comprising step of selecting said elongated shape to be substantially a shape selected from a group consisting of: an ellipse, an oval, a rectangle, a fillet rectangle, an elongated hexagon, an elongated octagon, an elongated decagon, and any combination thereof.

8. The method of claim 6, additionally comprising at least one step selected from a group consisting of: selecting a ratio of length of said long axis to said length of said short axis to be greater than about 6; selecting said length of said long axis to be less than about 30 mm; selecting said length of said short axis to be less than about 5 mm; selecting said thickness t of said elliptical sensing region to be in a range from about 10 nm to about 1 µm; and any combination thereof.

9. The method of claim 6, additionally comprising step of comprising said sensing region of a soft magnetic material, said soft magnetic material selected from a group consisting of: permalloy, and alloys consisting of elements selected from a group consisting of: Ni, Co, Fe, Cr, N and any combination thereof.

10. The method of claim 9, additionally comprising steps of comprising said sensing region of a non-magnetic material, said non-magnetic material capping said magnetic material, said non-magnetic material selected from a group consisting of: tantalum, Ti, Cr, SiO, Al$_2$O$_3$ and any combination thereof.

11. The method of claim 6, additionally comprising at least one step selected from a group consisting of:
    (a) calculating the effective value of said uniaxial magnetic anisotropy H$_k$ from $$H_k \approx 4\pi M_s \frac{t}{b}$$

where t is said thickness of said sensing region b is said length of said short axis and $M_s$ is the saturation magnetization of the material of the sensing region;
(b) for said elliptical elongated shape, calculating an optimal sensing region thickness $t_{opt}$ that minimizes equivalent magnetic noise from $$t_{opt} = \frac{H_a \cdot b}{4\pi M_s}$$

where $H_a$ is the intrinsic anisotropy field, b is said length of said short axis and $M_s$ is the saturation magnetization of the material of the sensing region.

12. The method of claim 6, additionally comprising steps of exciting the sensor by an AC excitation current, and selecting the frequency of said current to be in a range of about 500 Hz to about 1 MHz, such that the frequency of said output voltage is in a range where 1/f noise of an electronic preamplifier is negligible.

13. The method of claim 6, additionally comprising steps of selecting the amplitude of said excitation current to be sufficiently large such that 1/f noise of the sensor is dominant in the frequency range of interest for a measured field.

14. The method of claim 6, additionally comprising step of fabricating n sensors on a single substrate, n is an integer greater than or equal to one.

15. The method of claim 14, additionally comprising at least one step selected from a group consisting of: (a) providing at least two of said n sensors having different effective anisotropies so as to measure different ranges of magnetic fields; (b) providing at least two of said n sensors having differently oriented long axes so as to measure the two components of the magnetic field in the plane of the chip, and any combination thereof.

16. The method of claim 15, additionally comprising step of characterizing said at least two sensors of different anisotropies by a difference in parameter selected from a group consisting of: said ratio of said thickness t to said length of said short axis.

17. A chip comprising n planar Hall-effect sensors, n is an integer greater than or equal to two, each of said planar Hall-effect sensor comprising:
   a. an easy axis;
   b. two current-injecting terminals;
   c. two voltage measuring terminals; and
   d. a magnetic sensing region, of an elongated shape, said shape characterized by:
      (i) a long axis,
      (ii) a short axis perpendicular to said long axis,
      (iii) a thickness t;
      (iv) two ends, each of which is electrically connected to one said current-injecting terminal, and
      (v) two sides, each of which is electrically connected to one said voltage measuring terminal;
   wherein, at least two of said n sensors have differently oriented long axes so as to measure the two components of the magnetic field in the plane of the chip.

18. The chip of claim 17, wherein:
(a) said elongated shape is substantially a shape selected from a group consisting of: an ellipse, an oval, a rectangle, a fillet rectangle, an elongated hexagon, an elongated octagon, an elongated decagon, and any combination thereof;
(b) said long axis is less than about 30 mm long;
(c) said short axis is less than about 5 mm long; or
(d) said thickness of said sensing region is in a range from about 10 nm to about 1 μm; or any combination of (a) through (d).

* * * * *